US009953525B2

(12) United States Patent
Buschmann et al.

(10) Patent No.: US 9,953,525 B2
(45) Date of Patent: Apr. 24, 2018

(54) APPROACH DETECTION DEVICE

(71) Applicants: Gerd Buschmann, Velbert (DE);
Sebastian Raulin, Essen (DE)

(72) Inventors: Gerd Buschmann, Velbert (DE);
Sebastian Raulin, Essen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 143 days.

(21) Appl. No.: 14/405,987

(22) PCT Filed: Jun. 4, 2013

(86) PCT No.: PCT/EP2013/061418
§ 371 (c)(1),
(2) Date: Dec. 5, 2014

(87) PCT Pub. No.: WO2013/186077
PCT Pub. Date: Dec. 19, 2013

(65) Prior Publication Data
US 2015/0161887 A1 Jun. 11, 2015

(30) Foreign Application Priority Data
Jun. 13, 2012 (DE) .................... 10 2012 105 117

(51) Int. Cl.
*B60R 25/10* (2013.01)
*G08B 25/00* (2006.01)
(Continued)

(52) U.S. Cl.
CPC ........... *G08G 1/042* (2013.01); *H03K 17/955* (2013.01); *H03K 2217/960755* (2013.01)

(58) Field of Classification Search
CPC .......... E05B 81/78; E05B 81/77; E05B 85/16; E05B 77/34; E05B 17/10; Y10T 292/57; B60R 25/246
See application file for complete search history.

(56) References Cited

U.S. PATENT DOCUMENTS 5,528,453 A * 6/1996 Berman .................. A45C 5/14
280/47.26
6,256,932 B1 * 7/2001 Jyawook ................ E05B 77/24
292/336.3
(Continued)

FOREIGN PATENT DOCUMENTS

DE 102005061755 A1 6/2007
EP 1284335 A1 2/2003
(Continued)

OTHER PUBLICATIONS

International Preliminary Report on Patentability and Written Opinion of the International Searching Authority of International Application No. PCT/EP2013/061418 dated Dec. 24, 2014, 9 pages (English Translation).
(Continued)

*Primary Examiner* — Steven Lim
*Assistant Examiner* — Muhammad Adnan
(74) *Attorney, Agent, or Firm* — Fay Sharpe LLP

(57) ABSTRACT

An approach detection device for motor vehicles includes a sensor carrier and a sensor electronic system disposed in a receiving space therein. The device includes a capacitive approach sensor coupled to an evaluation circuit which has a capacitive surface for detecting approaches. The device is mounted via a carrier frame, including a fastening section, to a vehicle body part and includes a detection opening. The sensor carrier is fastened to the carrier frame such that the active capacitive surface of the sensor is oriented toward the detection opening. A receiving space is defined by the detection opening and the sensor carrier and is formed in the region of the detection opening. A sealing element is disposed in the receiving space on the sensor carrier.

16 Claims, 4 Drawing Sheets

(51) Int. Cl.
| | |
|---|---|
| *H04Q 1/00* | (2006.01) |
| *G01V 3/00* | (2006.01) |
| *G08B 13/08* | (2006.01) |
| *G08B 13/26* | (2006.01) |
| *G08G 1/042* | (2006.01) |
| *H03K 17/955* | (2006.01) |

(56) References Cited

U.S. PATENT DOCUMENTS

| | | | | |
|---|---|---|---|---|
| 6,349,450 | B1* | 2/2002 | Koops | E05B 17/0016 16/430 |
| 7,049,940 | B2* | 5/2006 | Ieda | B60R 25/246 307/10.5 |
| 7,333,021 | B2* | 2/2008 | Ieda | B60Q 1/2669 340/425.5 |
| 7,576,631 | B1* | 8/2009 | Bingle | E05B 81/76 340/5.54 |
| 7,607,809 | B2* | 10/2009 | Misawa | B60Q 1/2669 362/487 |
| 7,751,664 | B2* | 7/2010 | Ieda | B60Q 1/2669 250/216 |
| 7,819,442 | B2* | 10/2010 | Ieda | B60R 25/24 292/336.3 |
| 7,911,321 | B2* | 3/2011 | Bingle | E05B 81/76 340/5.54 |
| 8,333,492 | B2* | 12/2012 | Dingman | B60Q 1/2665 362/399 |
| 8,579,481 | B2* | 11/2013 | Minter | B60Q 1/2669 340/5.72 |
| 8,807,807 | B2* | 8/2014 | Wheeler | B60Q 3/002 362/501 |
| 8,814,231 | B2* | 8/2014 | Gandhi | E05B 77/06 292/336.3 |
| 2004/0188150 | A1* | 9/2004 | Richard | G06F 3/041 178/18.01 |
| 2004/0217601 | A1* | 11/2004 | Garnault | E05B 81/78 292/336.3 |
| 2006/0232378 | A1* | 10/2006 | Ogino | B60R 25/246 340/5.62 |
| 2007/0171057 | A1* | 7/2007 | Ogino | B60R 25/246 340/545.7 |
| 2007/0227203 | A1* | 10/2007 | Weber | E05B 81/78 70/91 |
| 2008/0003054 | A1* | 1/2008 | Fan | B60R 11/02 403/122 |
| 2008/0067052 | A1 | 3/2008 | Glew | |
| 2008/0202912 | A1* | 8/2008 | Boddie | H03K 17/962 200/600 |
| 2008/0290668 | A1* | 11/2008 | Ieda | B60R 25/24 292/198 |
| 2008/0290688 | A1* | 11/2008 | Brockhoff | B60J 7/1851 296/121 |
| 2010/0136917 | A1* | 6/2010 | Castandet | G01D 3/028 455/63.1 |
| 2010/0277379 | A1* | 11/2010 | Lindackers | H01Q 1/1207 343/713 |
| 2010/0315267 | A1 | 12/2010 | Chung et al. | |
| 2011/0025522 | A1* | 2/2011 | Peschl | E05B 81/76 340/686.6 |
| 2011/0057773 | A1 | 3/2011 | Newman et al. | |
| 2011/0260831 | A1* | 10/2011 | Ieda | B60R 25/246 340/5.64 |
| 2012/0133159 | A1* | 5/2012 | Tateishi | E05B 81/77 292/336.3 |
| 2012/0153972 | A1* | 6/2012 | Stockschlager | E05F 15/46 324/672 |
| 2014/0246873 | A1* | 9/2014 | Raulin | E05B 81/77 292/336.3 |
| 2015/0091311 | A1* | 4/2015 | Witte | E05B 77/34 292/336.3 |

FOREIGN PATENT DOCUMENTS

| | | |
|---|---|---|
| EP | 1349280 A1 | 10/2003 |
| EP | 1582670 A2 | 10/2005 |
| EP | 2275243 A1 | 1/2011 |

OTHER PUBLICATIONS

International Search Report of International Application No. PCT/EP2013/061418 dated Feb. 25, 2014, 5 pages (German Text).

* cited by examiner

APPROACH DETECTION DEVICE

BACKGROUND

The invention relates to an approach detection device having a sensor system for detecting the approach of a user. In particular the invention relates to approach detection devices having a capacitive approach sensor.

Capacitive sensors, or corresponding systems are known from the prior art, and can detect the approach of a user without physical contact. For this, the change in the capacity of an electrode assembly is measured, wherein the capacity is a function of the distance of a body part of the user to the electrode assembly. An electrode assembly of this type is described, for example, in DE 10 2005 061 755 A1.

Capacitive sensor systems are used in "Passive Entry" systems, among others, in which the user no longer needs to actively actuate a button on a remote control unit in order to open a vehicle. Instead, it is sufficient for the user to carry a remote control, also known as an ID provider (identification provider). As soon as a user approaches an approach detection device, this approach is detected by the capacitive approach sensor, upon which a control device disposed in the motor vehicle transmits a radio signal to the ID provider via a transmitting antenna, which awakens the ID provider from the so-called "sleep mode." Reception of the wake-up signal initiates a radio signal dialog between the ID provider and the control device for the motor vehicle, with which the authorization, or non-authorization, respectively, from the ID provider is ascertained for opening the motor vehicle. Insofar as the authorization of the ID provider is ascertained in the course of the radio signal dialog, a lock in the motor vehicle, allocated to the sensor system, is unlocked, such that a lock (door lock, trunk, engine hood) can be opened by a subsequent actuation of a handle, or the execution of a specific gesture.

The typically used capacitive approach sensors are strongly dependent on environmental conditions; humidity, condensation and other influences can impact the capacity of the sensor system, such that the detection of the approach of a body part of the user is impeded due to the disturbances.

By way of example, door handle systems in which capacitive approach sensors are used, which are protected against environmental influences, are described in the prior art. By way of example, EP 03 100 728.9 discloses a system in which the capacitive sensor assembly is disposed behind a housing wall. The space between the sensor assembly and the housing wall is filled with an electrically insulating material, in order to prevent the entry of moisture or other contaminants that could affect the capacity of the sensor system.

In particular in the proximity of the electrodes in the capacitive sensor, the impact of disturbing effects is to be prevented as much as possible. For this, it has been suggested in the prior art to embed capacitive sensors in a casting compound, in order to thus prevent a direct influence on the sensor surfaces. According to this prior art, the entire space between a cast electrode assembly of this type and a wall of a door handle is filled with insulating material.

The disadvantage with this system, however, is that the impact of the material, even if it keeps damaging effects away from the detection region of the capacitive sensor, is detrimental to the detection sensitivity of the capacitive sensor. Although the material is electrically insulating, the capacity is nevertheless affected by this dielectric medium.

The disadvantage with the solutions according to the prior art is, furthermore, that the components used therein must be manufactured specifically for one sensor device, meaning that they cannot be used in similar systems. Accordingly, specialized components must be produced for each application, which increases the costs for the known devices.

The objective of the invention is to create a universally applicable approach detection device that is protected against environmental influences.

BRIEF SUMMARY

The objective is attained, according to the invention, by means of an approach detection device according to claim 1.

The approach detection device according to the invention comprises a sensor carrier having a receiving space, wherein a sensor electronics system is disposed in the receiving space, said sensor electronics system having at least one capacitive approach sensor coupled to an evaluation circuitry, having an active capacitive surface for detecting the approach.

The approach detection device further comprises a carrier frame, which comprises a fastening section, with which the approach detection device can be mounted to a vehicle body part of a motor vehicle, as well as comprising a detection opening.

The sensor carrier is attached to the carrier frame such that the active capacitive surface of the capacitive approach sensor is oriented toward the detection opening, and is exposed thereby, meaning that the active capacitive surface is not covered by the carrier frame, to thus avoid any impact on the capacity.

A receiving space is formed in the region of the detection opening by the detection opening itself and the sensor carrier, in which a sealing means is disposed, which is disposed in the receiving space on the sensor carrier at least in the region of the active capacitive surface of the capacitive approach sensor.

The approach device according to the invention is constructed in a substantially modular manner, such that individual elements of the approach device can be adapted to different fields of application. In different detection scenarios, a different sensor electronics system can simply be built into the sensor carrier, for example. The sensor carrier and the carrier frame are preferably coordinated to one another such that a complex attachment to one another is not necessary. By way of example, the sensor carrier can simply be clipped or clicked into the carrier frame.

The sealing means is normally a compressible, preferably closed-cell foam, which has a sealing effect with regard to liquids, oils and other contaminants, which has, however, only a very slight impact on the detection capacity of the capacitive sensor due to its cell-like structure.

The depth of the receiving space defined by the sensor carrier and the detection opening is preferably less than the height of the sealing means, meaning that the sealing means extends, when the approach detection device is not in the mounted state, beyond the plane of the carrier frame defined by the fastening section of the carrier frame, and is compressed over the fastening section of the carrier frame in the receiving space when the approach detection device is mounted. As a result, manufacturing tolerances can be compensated for, such that it is always ensured that, at least in the region of the active capacitive surface of the capacitive sensor, an optimal protection is provided by the sealing means.

By means of the substantially modular construction and the use of the sealing means, an approach detection device is provided that can be manufactured in a cost-effective manner, and can be used universally, and is simultaneously protected against the influences of weather.

To compensate for manufacturing tolerances and to optimize the protection by means of the sealing means, this sealing means can extend over the plane defined by the fastening section of the carrier frame when it is not in the mounted state; when mounted to the vehicle body part, a compression of the sealing means in the receiving space then occurs.

In order to restrict the expansion pressure of the sealing means, it is provided in a preferred embodiment that the sealing means exhibits at least one through hole. A compression of the sealing means remains in the region of this through hole, which does not open out to one of the edges of the sealing means in order to prevent the entry of liquids, for example, by means of which the expansion pressure is reduced in comparison with a sealing means that does not have a through hole. The number of through holes depends on the respective application. One advantage of this embodiment is that, furthermore, in the regions of the through hole(s), no impairment to the detection capacity of the capacitive sensor occurs due to the sealing means.

In order to prevent excessive compression of the sealing means when the approach detection device is mounted, the sensor carrier comprises, in a preferred embodiment, at least one projection, which is complementary to the through hole, in the region exposed by the receiving space. This complementary projection does not extend beyond the plane defined by the fastening section of the carrier frame, and can serve as a type of stop, or spacer, respectively, in the region of the detection opening, such that, on one hand, the sealing means is not too strongly compressed when the approach detection device is mounted to the vehicle body, and a minimum spacing of the active capacitive surface to the vehicle body part of the motor vehicle, defined by the height of the projection, is ensured. With a design of the sensor carrier in this manner, sections or sub-regions of the capacitive approach sensor can be disposed in these regions, such that the capacitive surface of the sensor exhibits a slight spacing to the vehicle body part.

The approach detection device is mounted to the vehicle body part of the motor vehicle via the fastening section. By way of example, the approach detection device can be screwed onto the vehicle body of the motor vehicle via holes present in the fastening section using appropriate fastening means. A fastening of this type, however, is disadvantageous in this respect, because this requires a modification of the vehicle body, and additional fastening means are necessary. A preferred embodiment of the approach detection device is characterized in that an adhesive coating is disposed on at least sections of the surface of the fastening section of the carrier frame facing the vehicle body part of the motor vehicle, with which the approach detection device can be mounted to the vehicle body of the motor vehicle. The necessity for additional fastening means, which engage into the vehicle body part, no longer exists; the approach detection device can be quickly and efficiently mounted to the vehicle body part by means of the adhesive coating. In this context, the through holes in the sealing means are particularly advantageous, because, due to the reduced expansion pressure of the sealing means, the force acting against the adhesion is reduced, such that the combination, adhesion/arrangement of through holes in the sealing means, functions together in a positive manner.

The sealing means can be entirely produced from a special plastic. In a preferred embodiment of the approach detection device, the sealing means is multi-layered, wherein the layers adjoining the sensor carrier and provided for application onto the vehicle body are softer. This further contributes to reducing the expansion pressure of the sealing means, without having a negative impact on the general stability and protective effects of the sealing means.

The approach detection device according to the invention is constructed in a modular manner, comprising simple components, such that the costs can be kept to a minimum. In order to avoid the problem of having to supply different carrier frames for different vehicle types, which are adapted to the shape of the vehicle body part to which the approach detection device is to be mounted, an adapter layer, which exposes the detection opening, is disposed on the fastening section in a preferred embodiment of the approach detection device, by means of which the approach detection device can be mounted to the vehicle body part of the motor vehicle. The mounting, in turn, can occur by means of an adhesive layer disposed on the adapter layer, or by other fastening means known to the person skilled in the art. The use of the adapter layer has the advantage that all of the rest of the components of the approach detection device are independent of the specific shape of the vehicle body part to which the approach detection device is to be mounted. Thus, only an adaption of the adapter layer is necessary for differently shaped vehicle body parts; all of the other components are independent of the shape of the vehicle body part.

In a preferred embodiment example of the approach detection device, the sensor carrier has a support section, and the sensor electronics system has a plug-in connection, wherein the plug-in connection is releasably fastened in the support section. The sensor electronics system in the sensor carrier is connected to the vehicle electronics system via the plug-in connector, wherein the plug-in connector is preferably designed as quick release fastener, such that it is possible to quickly establish a connection to the vehicle electronics system. The plug-in connector combines all of the electrical lines for the sensor electronics system, such that with the presence of a corresponding plug-in connector on the part of the motor vehicle, a quick and secure connection can be established, which is protected against the effects of weather.

BRIEF DESCRIPTION OF THE DRAWINGS

In the following, the approach detection device according to the invention shall be described in greater detail, based on the drawings, in which.

DETAILED DESCRIPTION

Figure 1A:
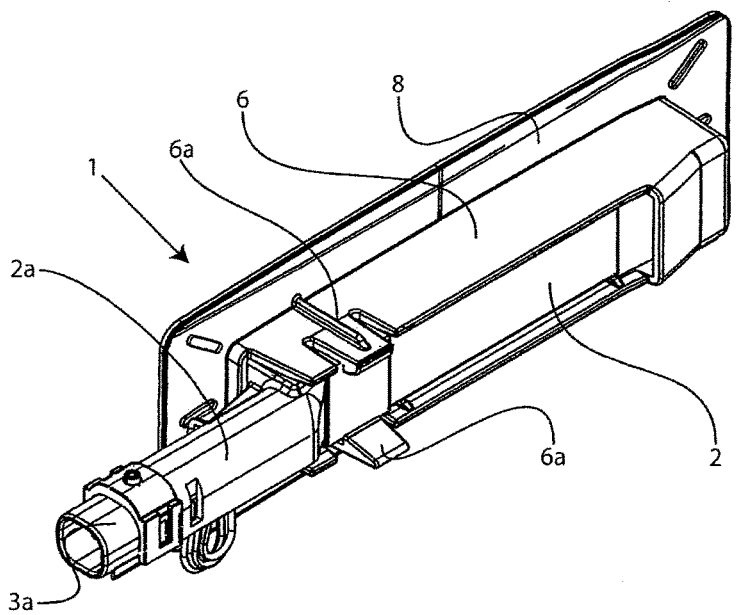
FIGS. 1A-1C show various views of a first embodiment of the approach detection device.
Figure 1B:
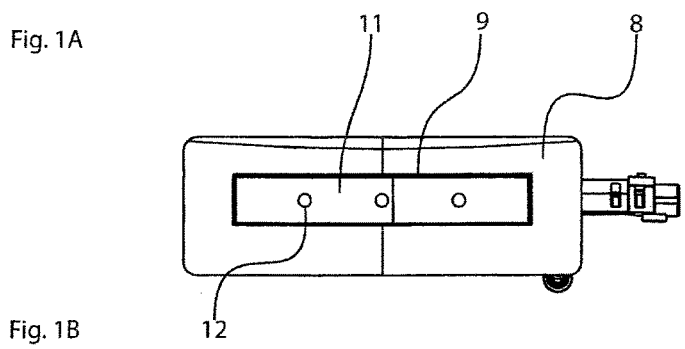
Figure 1C:
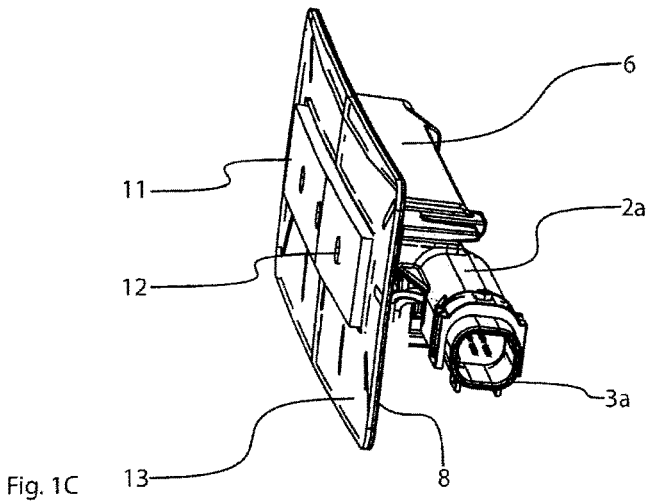

FIGS. 1A-1C show various views of a first embodiment of the approach detection device 1 according to the invention. The approach detection device comprises a carrier frame 6, having a fastening section 8 (see FIG. 1B) and a detection opening 9. The approach detection device 1 can be mounted to a vehicle body part of a motor vehicle via the fastening section 8. For this, an adhesive coating 13 can be disposed, at least in sections, on the surface of the fastening section 8 of the carrier frame 6 facing the vehicle body part of the motor vehicle, by means of which the approach detection device 1 can be mounted to the vehicle body part. Alternatively, the approach detection device 1 can be mounted to the vehicle body part via screws, for example.

The carrier frame 6 comprises a receiving space, in which a sensor carrier 2 is disposed. In the embodiment shown here, the carrier frame comprises two retaining means 6a, as well as a receiving opening 6b, by means of which the sensor carrier 2 is positioned in or on the receiving space of the carrier frame 6.

A sensor electronics system 3 (not discernable in FIGS. 1A-1C) is disposed, in turn, in the sensor carrier, which has at least one capacitive approach sensor 4 coupled to an evaluation circuitry, having an active capacitive surface 5 for detecting approaches. The sensor electronics system 3, or its arrangement in the sensor carrier 2 is comparable to that shown in FIG. 4, wherein a further structural component is used in the second embodiment shown in FIG. 4, which is not provided in the first embodiment.

The sensor electronics system is disposed in the sensor carrier 2 such that the active capacitive surface 5 of the capacitive approach sensor 4 is oriented toward the detection opening 9 in the carrier frame 6, meaning the detection opening 9 exposes the capacitive surface 5 of the capacitive approach sensor 4, in order to prevent an influence on the detection.

The sensor carrier 2 is disposed, in turn, in the carrier frame 6, such that the surface of the sensor carrier facing the detection opening 9 does not adjoin the plane formed by the fastening section 8 of the carrier frame 6, but rather, is displaced inward in relation to this plane, such that the detection opening 9 and the sensor carrier 2 form a receiving space in which a sealing means 11 is disposed.

Figure 2:
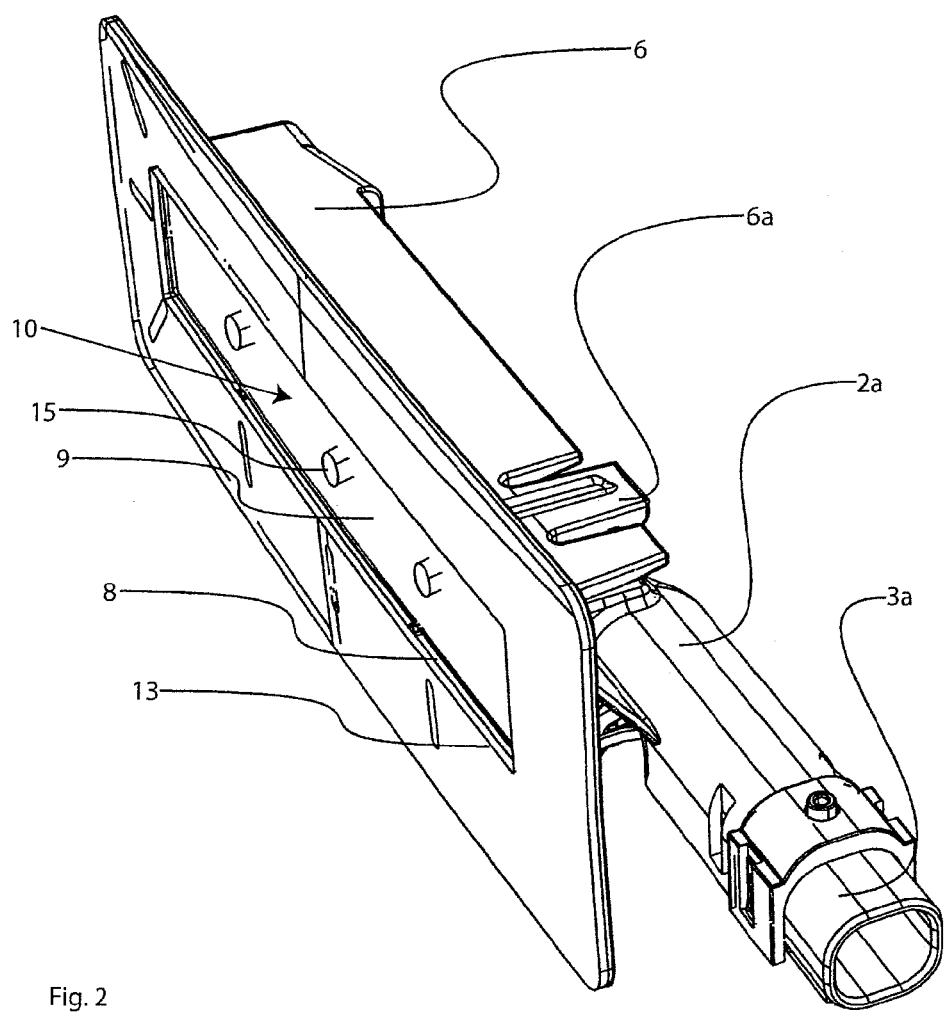
FIG. 2 shows a side view of the embodiment according to FIGS. 1A-1C, with the sealing means removed.

The receiving space 10 can be discerned in particular in the side view depicted in FIG. 2 of the embodiment shown in FIGS. 1A-1C. In FIG. 2, the adhesive coating 13 on the fastening section 8 of the carrier frame 6 can be clearly discerned.

The sealing means 11 comprises three through holes 12. These through holes 12 reduce the expansion pressure of the sealing means, which is formed by the compression of the sealing means when the approach detection device 1 is mounted to the vehicle body part; as can be seen in particular in FIG. 1C, the sealing means extends beyond the plane formed by the fastening section 8 of the carrier 6 when the approach detection device 1 is not mounted, in the first embodiment, such that a compression of the sealing means occurs when the device is mounted to the vehicle body part.

Three projections 15 are provided on the surface of the sensor carrier 2 facing the detection opening 9 in the first embodiment, which are complementary to the through holes 12 in the sealing means 11. The projections anchor the sealing means in the receiving space (the sealing means need not, as indicated by the first embodiment, fill the entire receiving space 10), and further ensure that a too strong compression of the sealing means 11 does not occur when the approach detection device is mounted to the vehicle body.

The sensor carrier 2 comprises a support section 2a, in which a plug-in connector 3a is retained as a component of the sensor electronics system 3. The sensor electronics system 3 of the approach detection device is connected to the vehicle electronics system by means of this plug-in connector 3a. The sensor electronics system 3 can include the evaluation circuitry coupled to the capacitive approach sensor 4, although this can also be a component of the vehicle electronics system. Using the plug-in connector 3a, the sensor electronics system can be quickly and reliably connected to the aforementioned vehicle electronics system.

Figure 3:
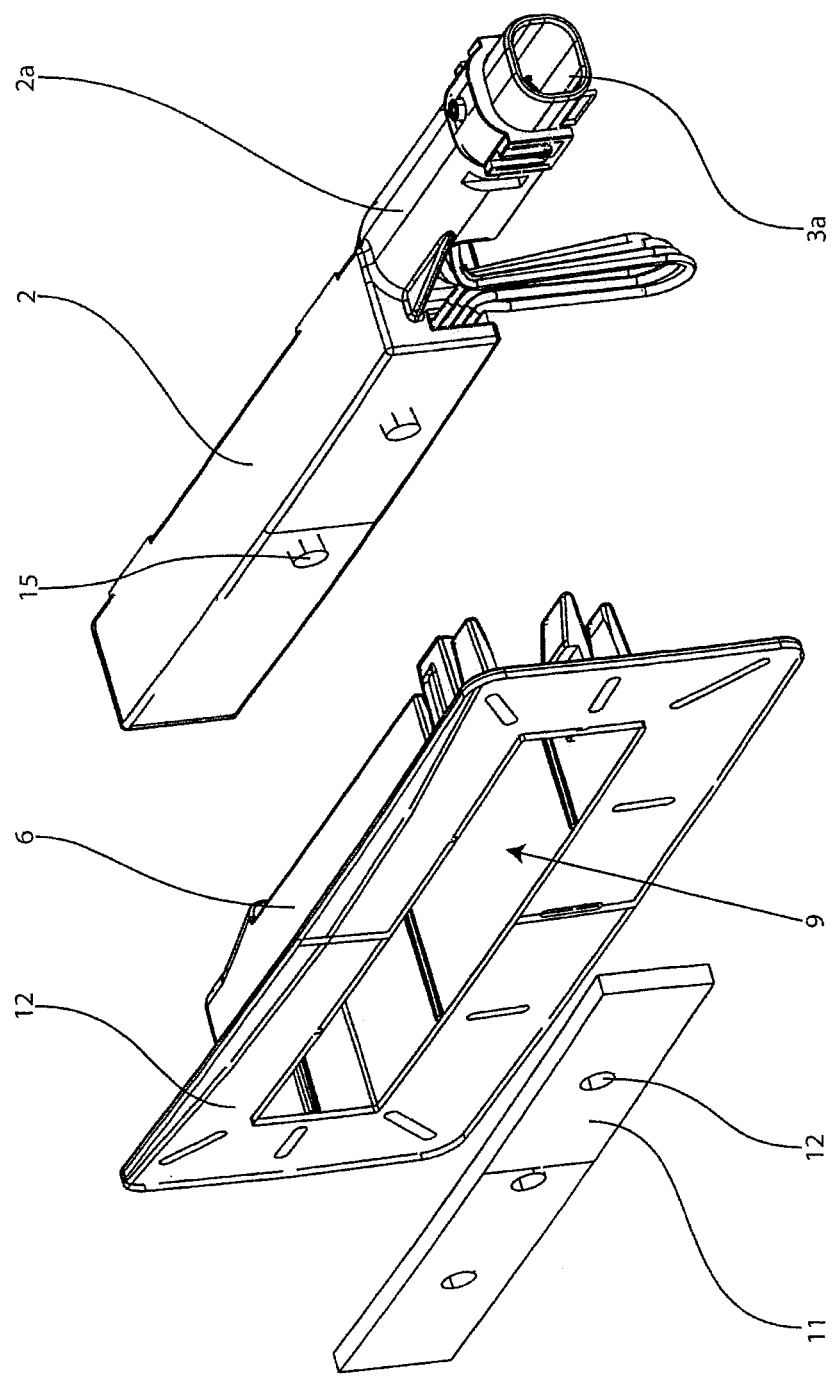
FIG. 3 shows an exploded view of the embodiment according to FIGS. 1A-1C.

FIG. 3 shows an exploded view of the embodiment of the approach detection device according to the invention shown in FIGS. 1A-1C, wherein, in particular, the sealing means 11 having the through holes 12, the carrier frame 6 having the fastening section 8 and detection opening 9, as well as the sensor carrier 2 having the support section 2a, can be discerned. In the depiction according to FIG. 3, the modular construction, in particular, of the approach detection device according to the invention can be discerned.

Figure 4:
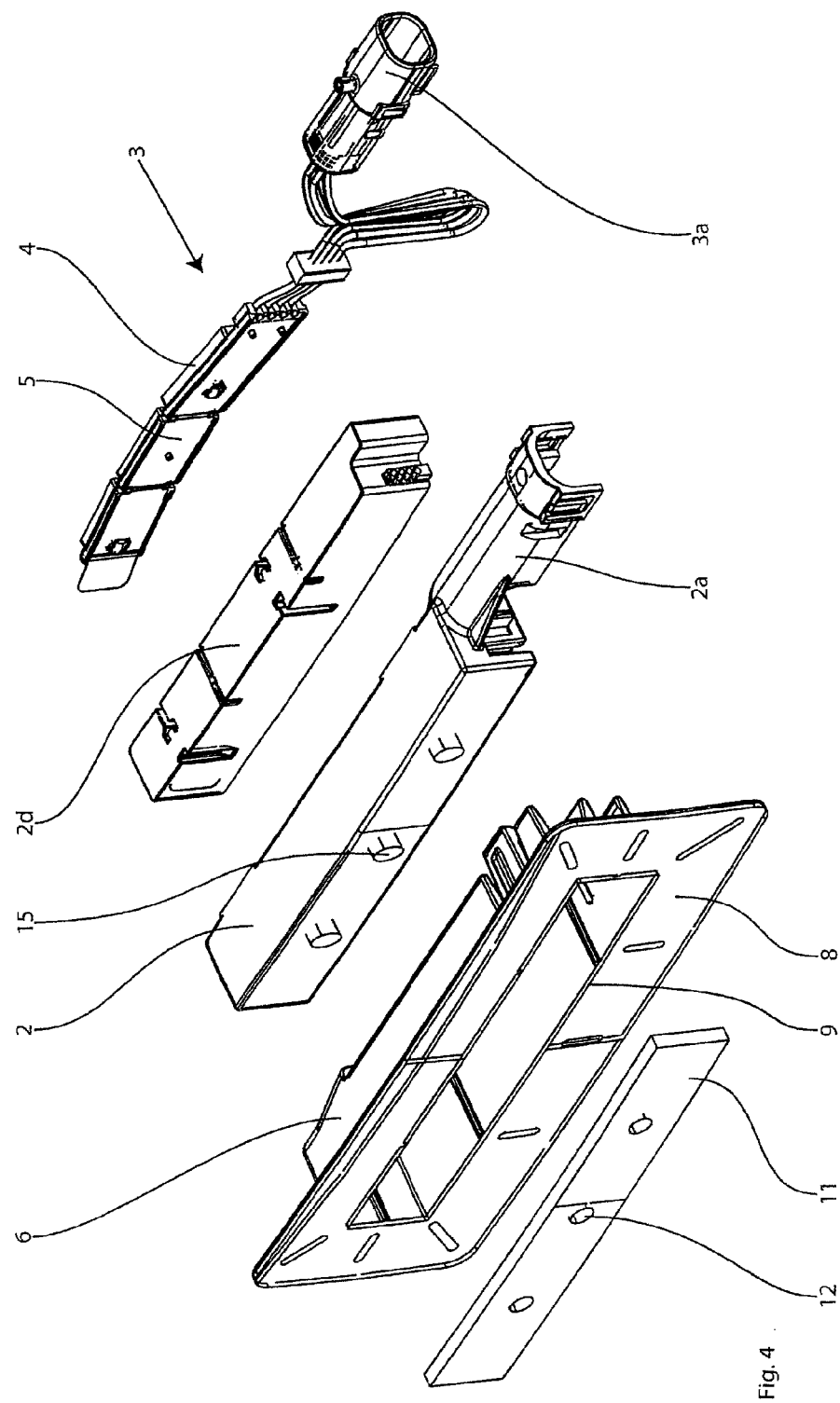
FIG. 4 shows a detailed exploded view of a second embodiment.

FIG. 4 shows a detailed exploded view of a second embodiment of the approach detection device according to the invention. In this depiction, details of the sensor electronics system can be discerned; a correspondingly constructed (not necessarily identical) sensor electronics system 3 is also a component of the first embodiment, wherein the sensor electronics system is not depicted in FIGS. 1A-1C, as well as FIGS. 2 and 3, in order to avoid an unnecessary inclusion of details.

The sensor electronics system 3 comprises a capacitive approach sensor 4, comprising three electrode in the present case, which form an active capacitive surface 5. The number of electrodes and their precise spatial arrangement in the sensor carrier depends on the respective application, and is not limited to the specific arrangement depicted herein.

In the embodiment depicted in these figures, the sensor carrier comprises a support element 2d, in which the sensor electronics system 3 is anchored, such that a movement of the sensor electronics in the sensor carrier is prevented. The support element 2d is adapted specifically to the shape of the sensor electronics system 3. As soon as the sensor electronics system 3 is attached to the support element 2d, it is simply slid into the sensor carrier 2, which is then, in turn, placed in or on the carrier frame 6. The sensor carrier 2 and the carrier frame 6 are independent of the design for the sensor electronics system 3 in the shown embodiment, because this is anchored in the sensor carrier via the support element.

The sensor electronics system 3 varies depending on the field of application and the design of the vehicle body part to which the approach detection device is to be mounted. The design of the sensor electronics system 3, and in particular the capacitive approach sensor 4 of the sensor electronics system 3, dictates the design of the sealing means 11. In the shown embodiment, the sealing means is disposed on the sensor carrier 3 such that the complete detection opening 9 is filled. In other embodiments, in which a smaller capacitive approach sensor 4 is used, it may be sufficient if the sealing means only fills the section of the detection opening 9 in which the active capacitive surface 5 physically abuts the wall of the sensor carrier 2.

The invention claimed is:

1. An approach detection device for a motor vehicle, comprising:
    a sensor carrier with a receiving space,
    a sensor electronics system disposed in the receiving space of the sensor carrier, having at least one capacitive approach sensor coupled to an evaluation circuitry, which has a capacitive surface for detecting approaches, and
    a carrier frame, comprising a fastening section, by means of which the approach detection device can be mounted to a vehicle body part of the motor vehicle, and comprising a detection opening, wherein the sensor carrier is fastened to the carrier frame such that the active capacitive surface of the capacitive approach sensor is oriented toward the detection opening, and is exposed thereby, and wherein a receiving space, defined by the detection opening and the sensor carrier, is formed in the region of the detection opening, and having a sealing means, which is disposed in the receiving space on the sensor carrier, at least in the region of the active capacitive surface of the capacitive approach sensor, wherein the sealing means fills the detection opening, wherein, when the approach detection device is not mounted to the vehicle body part, the sealing means extends beyond the plane of the carrier frame defined by the fastening section of the carrier frame, such that the sealing means is compressed in the receiving space when the approach detection device is mounted with its fastening section to the vehicle body part, wherein the sealing means includes at least one through hole for reducing an expansion pressure of the sealing means, wherein the expansion pressure is generated by a compression of the sealing means when the approach detection device is mounted to the vehicle body, and wherein the sensor carrier includes at least one projection complementary to the at least one through hole, the at least one projection anchoring the sealing means when the approach detection device is mounted to the vehicle body part.

2. The approach detection device according to claim 1, wherein the sensor carrier has at least one projection, complementary to at least one through hole defined in the sealing means, in the exposed region of the receiving space.

3. The approach detection device according to claim 1, wherein an adhesive coating is disposed, at least in sections, on the surface of the fastening section of the carrier frame facing the vehicle body part of the motor vehicle, with which the approach detection device can be mounted to the vehicle body part of the motor vehicle.

4. The approach detection device according to claim 1, wherein the sealing means is multi-layered, wherein the layers abutting the sensor carrier and provided for adjoining the vehicle body part are softer than a layer between the layer abutting the sensor carrier and the layer adjoining the vehicle body part.

5. The approach detection device according to claim 1, wherein an adapter layer, which exposes the detection opening, is disposed on the fastening section, with which the approach detection device can be mounted to the vehicle body part of the motor vehicle.

6. The approach detection device according to claim 1, wherein the carrier frame comprises numerous retaining means, with which the sensor carrier is anchored in or on the carrier frame.

7. The approach detection device according to claim 1, wherein the sensor carrier has a support section and the sensor electronics system has a plug-in connector, wherein the plug-in connector is releasably attached in the support section.

8. The approach detection device of claim 1 wherein the sealing means comprises a foam material.

9. An approach detection device for motor vehicles, comprising:

a sensor carrier including a receiving space, a sensor electronics system disposed in the receiving space of the sensor carrier, the sensor electronics system comprising evaluation circuitry and at least one capacitive approach sensor, which has a capacitive surface for detecting approaches, coupled to the evaluation circuitry, a carrier frame, comprising a detection opening and a fastening section, adapted to be mounted to a vehicle body part of the motor vehicle by the fastening section, and wherein the sensor carrier is fastened to the carrier frame such that the active capacitive surface of the capacitive approach sensor is oriented toward the detection opening, and is exposed thereby, and wherein a receiving space, defined by the detection opening and the sensor carrier, is formed in the region of the detection opening, and including a sealing member, which is disposed in the receiving space on the sensor carrier, at least in the region of the active capacitive surface of the capacitive approach sensor such that the complete detection opening is filled, wherein, when the approach detection device is not mounted to the vehicle body part, the sealing means extends beyond the plane of the carrier frame defined by the fastening section of the carrier frame, such that the sealing means is compressed in the receiving space when the approach detection device is mounted with its fastening section to the vehicle body part, at least one projection extending from the sensor carrier, wherein the sealing means includes at least one through hole for reducing an expansion pressure of the sealing means, wherein the expansion pressure is generated by a compression of the sealing means when the approach detection device is mounted to the vehicle body, and wherein the at least one projection extends through the at least one through hole to anchor the sealing means when the approach detection device is mounted to the vehicle body part.

10. The approach detection device of claim 9 wherein the sealing member is disposed in the carrier frame in front of the sensor carrier.

11. The approach detection device of claim 9 wherein the sealing member comprises at least two layers, a first layer being relatively softer than a second layer.

12. The approach detection device of claim 11 wherein the sealing member comprises first, second and third layers, wherein the first and third layers are relatively softer than is the second layer.

13. The approach detection device of claim 9 further comprising at least one retaining member adapted to retain the sensor carrier to the carrier frame.

14. The approach detection device of claim 9 further comprising an adhesive coating disposed on a fastening section of the carrier frame.

15. The approach detection device of claim 9 wherein the sensor carrier comprises a support section and the sensor electronics system includes a plug-in connector which is releasably attached to the support section.

16. The approach detection device of claim 9 wherein the sealing means comprises a foam material.

* * * * *